(12) United States Patent
Foxall

(10) Patent No.: US 6,885,193 B2
(45) Date of Patent: Apr. 26, 2005

(54) MAGNETIZATION PRIMER SEQUENCE FOR BALANCED STEADY STATE FREE PRECISION IMAGING

(75) Inventor: David L. Foxall, Mentor, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 199 days.

(21) Appl. No.: 10/294,015

(22) Filed: Nov. 14, 2002

(65) Prior Publication Data

US 2004/0095138 A1 May 20, 2004

(51) Int. Cl.$^7$ ................................................. G01V 3/00
(52) U.S. Cl. ........................ 324/309; 324/307; 600/410
(58) Field of Search ................................ 324/309, 307, 324/306, 312, 314, 300; 600/410, 413

(56) References Cited

U.S. PATENT DOCUMENTS

| | | | | |
|---|---|---|---|---|
| 4,769,603 | A |   | 9/1988 | Oppelt et al. ................ 324/309 |
| 5,034,692 | A |   | 7/1991 | Laub et al. ................... 324/309 |
| 5,347,216 | A |   | 9/1994 | Foo ............................. 324/309 |
| 5,404,882 | A | * | 4/1995 | Santyr ......................... 600/410 |
| 5,420,510 | A | * | 5/1995 | Fairbanks et al. ........... 324/309 |
| 5,541,514 | A |   | 7/1996 | Heid et al. ................... 324/309 |
| 6,307,368 | B1 | * | 10/2001 | Vasanawala et al. ........ 324/309 |
| 6,310,478 | B1 |   | 10/2001 | Heid ............................ 324/309 |
| 6,462,545 | B1 | * | 10/2002 | Busse et al. ................. 324/309 |
| 6,677,750 | B1 | * | 1/2004 | Hennig et al. ............... 324/307 |

OTHER PUBLICATIONS

Hennig, et al. "Optimization of Signal Behavior in the Transition to Driven Equilibrium in Steady–State Free Precession Sequences", Magnetic Resonance in Medicine 48:801–809 (2002).

Deimling, et al. "Magnetization Prepared True FISP Imaging", Proc. 2nd Annual Meeting, Society Magn. Resonance, 1994, p. 495.

Heid, "True FISP Cardiac Fluoroscopy", Proc. 5th Annual Meeting, ISMRM, 1997 p. 320.

Turner, "Binomial Solvent Suppression", Journal of Magnetic Resonance, 54, 146–148 (1983).

Hargreaves, "Characterization and Reduction of the Transient Response in Steady–State MR Imaging", Magnetic Resonance in Medicine 46:149–158 (2001).

Plateau, "Exchangeable Proton NMR Without Base–Line Distortion Using New Strong–Pulse Sequences", J. Am. Chem. Soc. 1982, 104 7310–7311.

Zur, et al. "Motion–Insensitive, Steady–State Free Processing Imaging", Magnetic Resonance in Medicine, 16, 444–459 (1990).

Duerk, et al. "Remember True FISP? A High SNR, Near 1–Second Imaging Method For T2–Like Contrast in Interventional MRI at .2T", JMRI 1998; 8:203–208.

(Continued)

*Primary Examiner*—Louis M. Arana
(74) *Attorney, Agent, or Firm*—Fay, Sharpe, Fagan, Minnich & McKee, LLP

(57) ABSTRACT

To prepare magnetization for steady state magnetic resonance imaging, magnetic resonance is primed using a parameterized priming sequence (60). The parameterized priming sequence (60) has a spectral offset parameter value (40) corresponding to a spectral offset of the steady state imaging. Subsequent to the priming, steady state magnetic resonance imaging data at the first spectral offset is acquired using a magnetic resonance imaging scanner (10). A reconstruction processor (44) reconstructs the imaging data to generate an image representation. Preferably, the parameterized priming sequence (60) includes a longitudinal priming sequence (62) that prepares longitudinal magnetization in a state approximating a steady state longitudinal magnetization. A spoiler sequence (64) spoils transverse magnetization while retaining longitudinal magnetization. A transverse priming sequence (66) prepares traverse magnetization in a state approximating a steady state transverse magnetization.

30 Claims, 10 Drawing Sheets

OTHER PUBLICATIONS

Oppelt, et al. "FISP: eine neue schnelle Puls–sequenz für die Kernspintomographie", Electromedica 54 (1996) heft 1.

Oppelt, et al. "FISP—a new fast MRI sequence", Electromedica 54 (1986) No. 1.

Hargreaves, et al. "Characterization and Reduction of the Transient Response in Steady–State MR Imaging", Magnetic Resonance in Medicine, 46: 149–158 (2001).

Foxall, "Starter Sequence for Steady–State Free Precession Imaging", Proc. Of Int'l. Soc. For Magnetic Resonance in Medicine, ISMRM, $11^{th}$ Scientific Meeting, Jul. 10, 2003, p. 959.

Foxall, "Frequency–Modulated Steady–State Free Precession Imaging", Magnetic Resonance in Medicine, 48: 502–508 (2002).

Hennig, "Optimization of Signal Behavior in the Transition in Driven Equilibrium in Steady–State Free Precession Sequences", Magnetic Resonance in Medicine 48:801–809 (2002).

Nishimura, et al., "Analysis and Reduction of the Transient Response in SSFP Imaging", Proc. Intl. Soc. Mag. Reson. Med. 8 (2000) p. 301.

Deimling, et al., "Magnetization Prepared True FISP Imaging", Proc. Of Soc. Of Mag. Res. $2^{nd}$ Meeting, vol. 1, Aug. 6, 1994, p. 495.

* cited by examiner

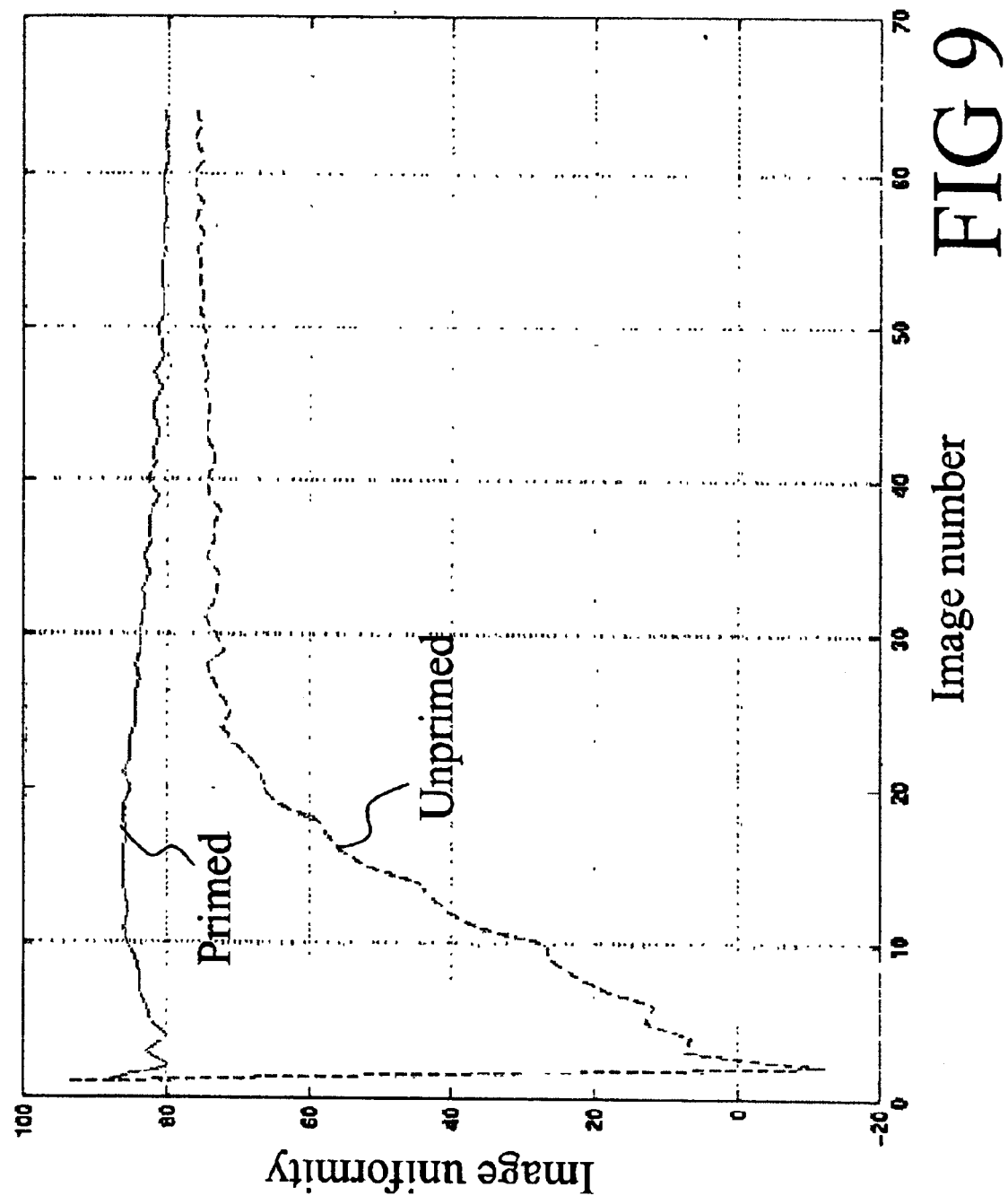

MAGNETIZATION PRIMER SEQUENCE FOR BALANCED STEADY STATE FREE PRECISION IMAGING

BACKGROUND OF THE INVENTION

The following relates to the diagnostic imaging arts. It particularly relates to primer sequences for steady state magnetic resonance imaging, and will be described with particular reference thereto. However, the following relates more generally to primer sequences for magnetic resonance imaging of various types.

Steady state magnetic resonance imaging includes a number of substantially similar techniques which are known by various nomenclatures in the art, such as completely balanced steady state free precession imaging (CBASS), fast imaging with steady state precession (FISP and trueFISP), fast imaging employing steady state acquisition (FIESTA), balanced fast field echo (BFFE), and is gradient recalled acquisition of the steady state (GRASS). Steady state imaging techniques provide rapid imaging (TR about 2–5 milliseconds) and contrast that is proportional to a ratio of spin lattice and spin-spin relaxation times (that is, T2/T1) with tip angles close to the Ernst angle. Strong contrast between fluids such as cerebro-spinal fluid and blood relative to other tissues is obtained, making CBASS useful for head and spine imaging, for vascular imaging throughout the body, for cardiac imaging, and the like.

While steady state imaging provides rapid imaging times, as low as 128 milliseconds, disadvantages reside in the slow convergence to steady state, and in the need to continuously pulse the spin system in an uninterrupted fashion in order to properly maintain the steady state magnetization condition.

To prepare the magnetization, the spin system is typically pulsed for about three times the spin-lattice relaxation time (that is, about 3×T1) to allow magnetization to reach steady state. Since spin-lattice T1 relaxation times for fluids such as the cerebro-spinal fluid are about two seconds, signal preparation time far exceeds signal acquisition time. The short TR of steady state imaging sequences also calls for high gradients and is rapid switching, which leads to significant gradient heating during the signal preparation period.

During imaging it is often desirable to pre-saturate particular nuclear signals such as those emanating from fat or flowing blood to improve the diagnostic usefulness of the resultant images. Application of a continuous train of RF pulses during balanced steady state free precession imaging makes inserting the special sections of pulse sequence to perform pre-saturation operations difficult without incurring either a heavy time penalty to restart the steady state or additional image artifacts.

Similarly, the long preparation period employed for preparing the steady state signal substantially limits the use of inversion recovery, T2 contrast, or black blood preparation sequences to modify the contrast available with basic steady state imaging.

To alleviate such problems, priming sequences have been developed which reduce the conditioning time for preparing the nuclear magnetic resonance signal for steady state imaging. However, these priming sequences are complex, non-intuitive, or are not readily adapted to different steady state imaging conditions. For example, complex, non-intuitive priming sequences are not readily adapted for imaging at several different spectral offsets. This limits their application in phase-cycled CBASS, which combines images obtained at two or more spectral offsets to reduce static banding artifacts. These sequences are also not well suited for storing existing steady state magnetization back along the longitudinal axis of the rotating frame, so that pre-saturation operations can be performed periodically during the imaging period, followed by rapid regeneration of the stored steady state signal.

The present invention contemplates an improved apparatus and method that overcomes the aforementioned limitations and others.

BRIEF SUMMARY OF THE INVENTION

According to one aspect, a steady state magnetic resonance imaging apparatus is disclosed. A means is provided for priming magnetic resonance using a parameterized priming sequence. The parameterized priming sequence has a spectral offset parameter value corresponding to a first spectral offset. A means is provided for acquiring imaging data using steady state magnetic resonance imaging at the first spectral offset subsequent to the priming. A means is provided for reconstructing the imaging data to generate an image representation.

According to another aspect, an apparatus for steady state magnetic resonance imaging is disclosed. A priming sequence generator generates a parameterized priming sequence configured using a spectral offset parameter. A magnetic resonance imaging scanner primes magnetic resonance using the parameterized priming sequence configured to a selected spectral offset. Subsequent to the priming, the magnetic resonance imaging scanner acquires imaging data using steady state magnetic resonance imaging at the selected spectral offset. A reconstruction processor reconstructs imaging data to generate an image representation.

According to yet another aspect, a steady state magnetic resonance imaging method is provided. Magnetic resonance is primed using a parameterized priming sequence. The parameterized priming sequence has a spectral offset parameter value corresponding to a first spectral offset. Subsequent to the priming, imaging data is acquired using steady state magnetic resonance imaging at the first spectral offset. The imaging data is reconstructed to generate an image representation.

One advantage resides in a substantial reduction in image artifacts in steady state magnetic resonance imaging.

Another advantage resides in reduced image scanning times for steady state magnetic resonance imaging.

Yet another advantage resides in providing a parameterized priming sequence that is readily adapted for different spectral offsets.

Still yet another advantage resides in providing a parameterized priming sequence which is readily adapted for different T1 and T2 relaxation times and consequently different steady state magnetizations.

Numerous additional advantages and benefits will become apparent to those of ordinary skill in the art upon reading the following detailed description of the preferred embodiments.

BRIEF DESCRIPTION OF THE DRAWINGS

The invention may take form in various components and arrangements of components, and in various process operations and arrangements of process operations. The drawings are only for the purpose of illustrating preferred embodiments and are not to be construed as limiting the invention.

FIG. 9 quantitatively compares image uniformity for the image sequences of FIGS. 8A and BB.

DETAILED DESCRIPTION OF THE PREFERRED EMBODIMENTS

Figure 1:
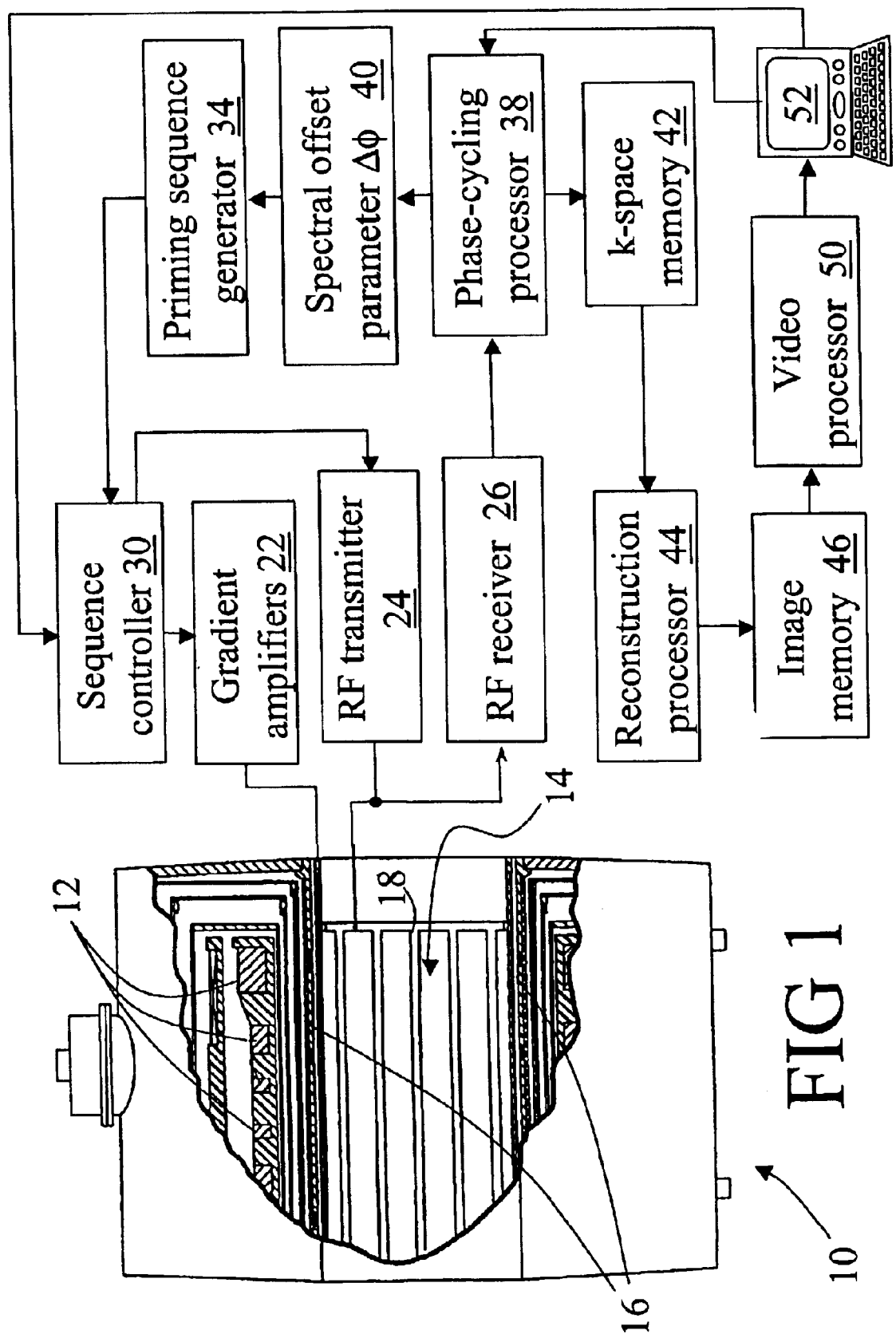
FIG. 1 shows a magnetic resonance imaging apparatus with a priming sequence generator for performing steady state magnetic resonance imaging.

With reference to FIG. 1, a magnetic resonance imaging scanner 10 includes a cylindrical main magnet 12, which is preferably superconducting and cryoshrouded. The main magnet 12 defines a magnet bore 14 inside of which a patient or other imaging subject is placed for imaging. The main magnet 12 produces a spatially and temporally constant and uniform main magnetic field oriented along a longitudinal axis of the bore 14. Instead of a superconducting magnet, a non-superconducting magnet can be used.

Magnetic field gradient coils 16 produce magnetic field gradients in the bore 14 for spatially encoding magnetic resonance signals, for producing magnetization-spoiling field gradients, or the like. Preferably, the magnetic field gradient coils 16 include coils configured to produce magnetic field gradients in three orthogonal directions including the longitudinal axial direction parallel to the main magnetic field.

A whole body radio frequency coil assembly 18 generates radio frequency pulses for exciting magnetic resonances. The radio frequency coil assembly 18 also serves to detect magnetic resonance signals. Optionally, additional local radio frequency coils or phased radio frequency coil arrays (not shown) are included for exciting and/or detecting magnetic resonances at localized areas in the bore 14.

Gradient pulse amplifiers 22 deliver controlled electrical currents to the magnetic field gradient coils 16 to produce selected magnetic field gradients. A radio frequency transmitter 24, preferably digital, applies radio frequency pulses or pulse packets to the radio frequency coil assembly 18 to generate selected magnetic resonance excitations. A radio frequency receiver 26 also coupled to the radio frequency coil assembly 18 receives magnetic resonance signals. If more than one radio frequency coil is provided (such as a local coil or phase coil array), then different coils are optionally used for the magnetic resonance excitation and detection operations.

To acquire magnetic resonance imaging data of a subject, the subject is placed inside the magnet bore 14, preferably at or near an isocenter of the main magnetic field. A sequence controller 30 communicates with the gradient amplifiers 22 and the radio frequency transmitter 24 to produce selected transient or steady state magnetic resonance configurations in the subject, to spatially encode such magnetic resonances, to selectively spoil transverse magnetic resonance components, or otherwise generate selected magnetic resonance signals characteristic of the subject. The generated magnetic resonance signals are detected by the radio frequency receiver 26.

The magnetic resonance scanner 10 and associated electronics are particularly suitable for acquiring steady state magnetic resonance imaging data. Steady state magnetic resonance imaging methods include a number of variations, and a number of different nomenclatures are commonly used in the art to refer to various types of steady state imaging. These include but are not limited to: completely balanced steady state free precession imaging (CBASS) also known as fast imaging with steady state precession (FISP); trueFISP which is a type of FISP wherein successive radio frequency pulses in the imaging excitation train are phase alternated; fast imaging employing steady state acquisition (FIESTA), balanced fast field echo (BFFE), and gradient recalled acquisition of the steady state (GRASS) which are substantially equivalent to CBASS and FISP. A common feature of these methods is application of radio frequency pulses spaced at a selected inter-pulse spacing that maintains coherence of nuclear magnetization during the steady state magnetic resonance imaging.

As is known in the art, the various steady state imaging methods employ periodic radio frequency excitation pulses, typically at a low flip angle, to maintain the magnetization in a steady state. Between excitation pulses, there is some relaxation of the magnetization and magnetic resonance signals are generated. Moreover, a spectral offset can be introduced by allowing the nuclear spins to accumulate a net phase increment between successive pulses of the periodic radio frequency excitation pulse train. A phase increment can be introduced by a variety of means: phase shifting the radio frequency pulses themselves, or applying gradient pulses to preferentially induce controlled phase shifts in moving or flowing spins. The net phase increment per inter-pulse period due to radio frequency phase-shifts, motion encoding gradient pulses, or both is designated by $\Delta\phi$.

For example, by phase shifting successive pulses by $\Delta\phi=180°$, a spectral offset typically referred to as a 180° spectral offset is obtained. A steady state imaging method employing a 180° spectral offset is trueFISP. Similarly, phase shifting successive pulses by $\Delta\phi=90°$ produces steady state imaging data at a 90° spectral offset. That is, for a 90° spectral offset successive radio frequency excitation pulses with phases of 0°, 90°, 180°270°, 0°, 90°, 180°, 270°, 0°, 90°, . . . are suitably employed.

To rapidly achieve the desired steady state magnetization at a selected spectral offset, a parameterized priming sequence generator 34 generates a priming sequence at a selected spectral offset. The priming sequence includes selected radio frequency pulses and magnetic field gradient pulses. The generated priming sequence is communicated to the sequence controller 30 for implementation by the magnetic resonance imaging scanner 10 and associated electronics 22, 24. The priming sequence produces a magnetization state that approximates the magnetization of the steady state imaging.

Moreover, to reduce static banding artifacts which are typically observed in CBASS and other types of steady state images, a phase-cycling processor 38 preferably coordinates CBASS imaging at several complementary spectral offsets, such as at a 0° and 180° spectral offsets, or at 0°, 90°, 180°, and 270° spectral offsets.

Often, a steady state image will have a null response or artifact band. When the same sequence is repeated with a 180° spectral offset, the artifact band shifts. Combining these two data sets reduces banding artifacts. Collecting the same data with 90°, and 270° spectral offsets shifts and alters the band positions again. Combining these four sets of data at 0°, 90°, 180° and 270° spectral offsets substantially eliminates banding artifacts. Other combinations of spectral offsets, such as 0°, 60°, 120°, 180°, 240°, 300°; or 0°, 120°, 240°; etc. are also contemplated.

More generally, images acquired at spectral offsets given by $\theta_o + 360° \times (n/N)$ where N specifies a total number of spectral offsets (N>1), n is a spectral offset index running from 0 to N−1, and $\theta_o$ is an angular offset value, produce substantial cancellation of static banding artifacts when combined.

For each spectral offset, the phase cycling processor 38 communicates a spectral offset parameter 40 to the priming sequence generator 34. The priming sequence generator 34 generates a priming sequence corresponding to the spectral offset parameter 40. In a preferred embodiment, the priming sequence generator 40 generates a parameterized priming sequence that is configured using the spectral offset parameter 40. Parameters controlling magnetization amplitude, flip angle, or other magnetization characteristics are also optionally transmitted to the priming sequence generator 34. The priming sequence produced by the priming sequence generator 34 is executed by the sequence controller 30, followed by CBASS imaging at the selected spectral offset $\Delta\phi$.

The phase-cycling processor 38 combines imaging data at the several complementary spectral offsets (for example, for spectral offsets $\Delta\phi$ of 0°, 90°, 180°, 270°) preferably by addition in complex k-space, and stores the combined k-space data in a k-space memory 42. The imaging data is reconstructed by a reconstruction processor 44 to produce an image representation that is stored in an image memory 46. In one suitable embodiment the reconstruction processor 44 performs an inverse Fourier transform reconstruction.

The resultant image representation is processed by a video processor 50 and displayed on a user interface 52, which is preferably a personal computer, workstation, or other type of computer. Rather than producing a video image, the image representation can be processed by a printer driver and printed, transmitted over a computer network or the Internet, or the like. Preferably, the user interface 52 also allows a radiologist or other operator to communicate with the magnetic resonance sequence controller 30, the phase-cycling processor 38, and other components to select magnetic resonance imaging sequences, modify magnetic resonance imaging sequences, execute magnetic resonance imaging sequences, and so forth.

Figure 2:
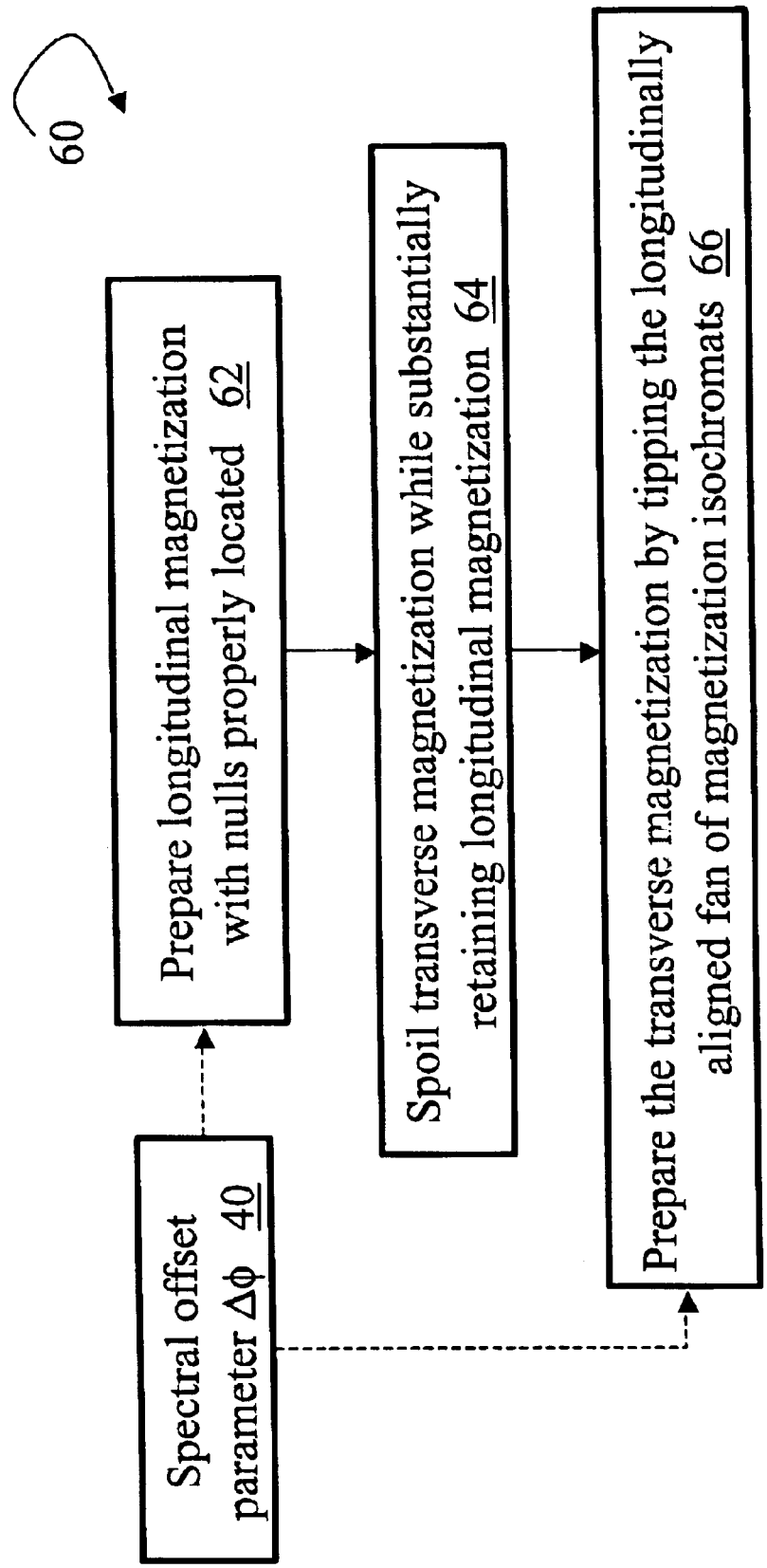
FIG. 2 diagrammatically shows a parameterized priming sequence for initiating a magnetization state preparatory to steady state magnetic resonance imaging.

With reference to FIG. 2, the priming sequence generator 34 preferably produces a parameterized priming sequence 60 that includes a longitudinal priming sequence 62 that prepares a longitudinal magnetization state with suitably positioned longitudinal magnetization nulls, and a spoiler sequence 64 that spoils any transverse magnetization while substantially retaining longitudinal magnetization. The combination of the longitudinal priming sequence 62 and the spoiler sequence 64 results in a fan of magnetization isochromats that are longitudinally aligned. A transverse priming sequence 66 prepares the transverse magnetization by tipping the longitudinally aligned fan of magnetization isochromats away from longitudinal alignment to an angle corresponding to the flip angle of the steady state magnetization of the CBASS or other steady state imaging.

The longitudinal magnetization that exists during steady state imaging is suitably approximated by an even periodic function $E(\psi)$ where $\psi$ is the net phase shift experienced by the spins due to resonance offset. That is, $$0 \leq E(\psi) \leq 1; \; E(0)=0; \; E(\psi)=E(\psi+2\pi) \qquad (1).$$

To account for the applied spectral offset ($\Delta\phi$) and to scale the longitudinal magnetization to approximate the steady state longitudinal magnetization, the longitudinal preparation sequence 62 should produce a longitudinal magnetization $M_z$ of the form:

$$M_z(\psi) = M_0 \cdot A \cdot E(\psi + \Delta\phi) \qquad (2),$$

where $M_0$ is the thermal equilibrium magnetization and A is an adjustable scaling constant. Advantageously, the function $M_z(\psi)$ has zeroes or nulls that conform with the target steady state magnetization.

Figure 3:
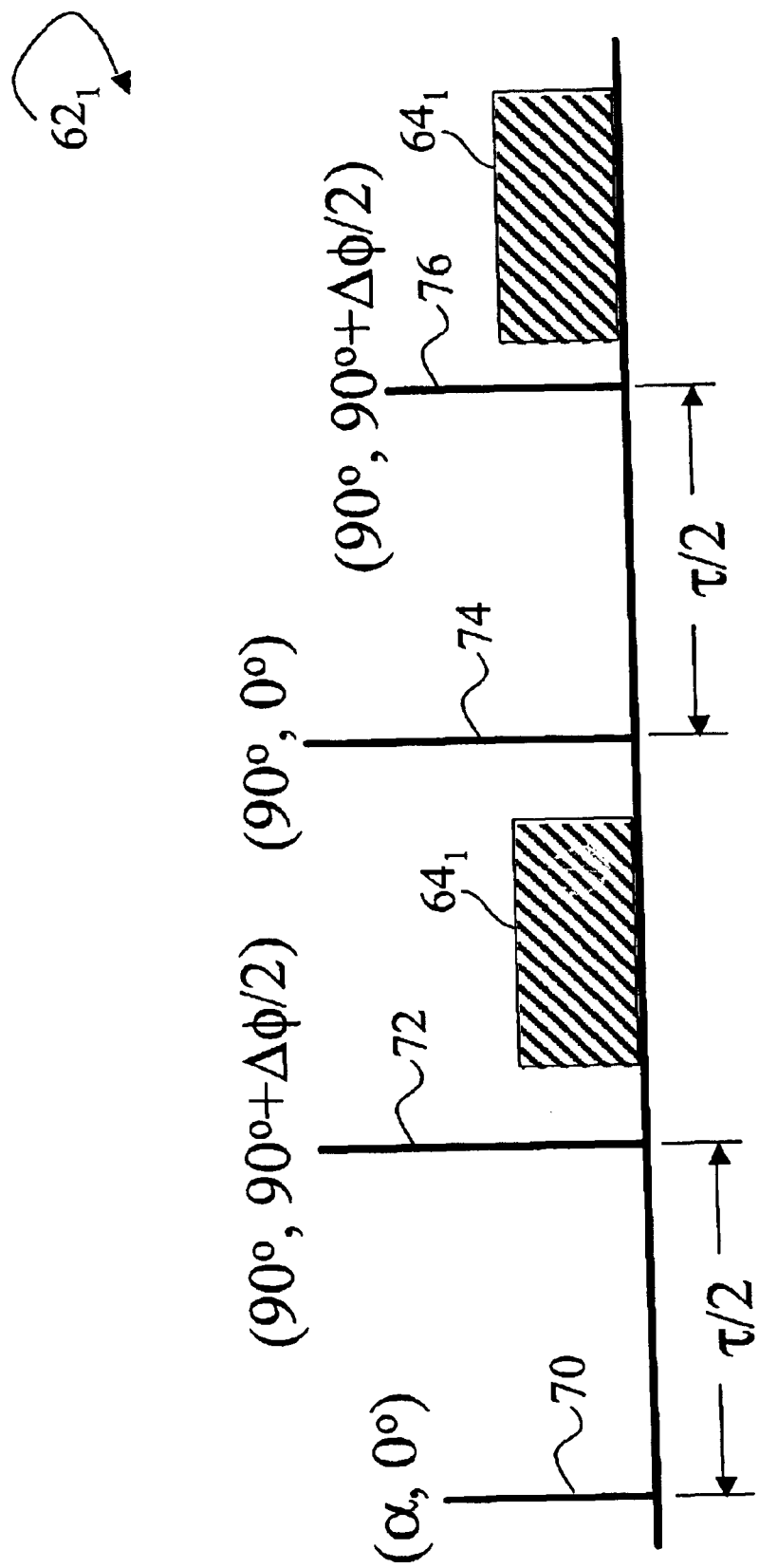
FIG. 3 diagrammatically shows a first exemplary priming sequence for preparing a longitudinal magnetization state for steady state magnetic resonance imaging.

With reference to FIG. 3, one suitable longitudinal preparation sequence $62_1$ includes a first set of radio frequency pulses 70, 72 temporally separated by $\tau/2$ where $\tau$ is the inter-pulse spacing or temporal repeat of the CBASS or other steady state imaging excitation pulses, followed by a second set of radio frequency pulses 74, 76 also separated by $\tau/2$. Each of the radio frequency pulses 70, 72, 74, 76 is labeled with an $(\theta_1, \theta_2)$ index where $\theta_1$ is the flip angle of the radio frequency pulse and $\theta_2$ the phase of the radio frequency pulse. The preparation sequence $62_1$, produces a suitable periodic magnetization $M_z$ of the form of Equation (2), in which $E(\psi)=\sin^2(\psi\Delta\phi)$ and $A=\sin(\alpha)$. Preferably, corresponding spoiler magnetic field gradient pulses $64_1$, are interleaved with the longitudinal preparation sequence $62_1$.

Figure 4:
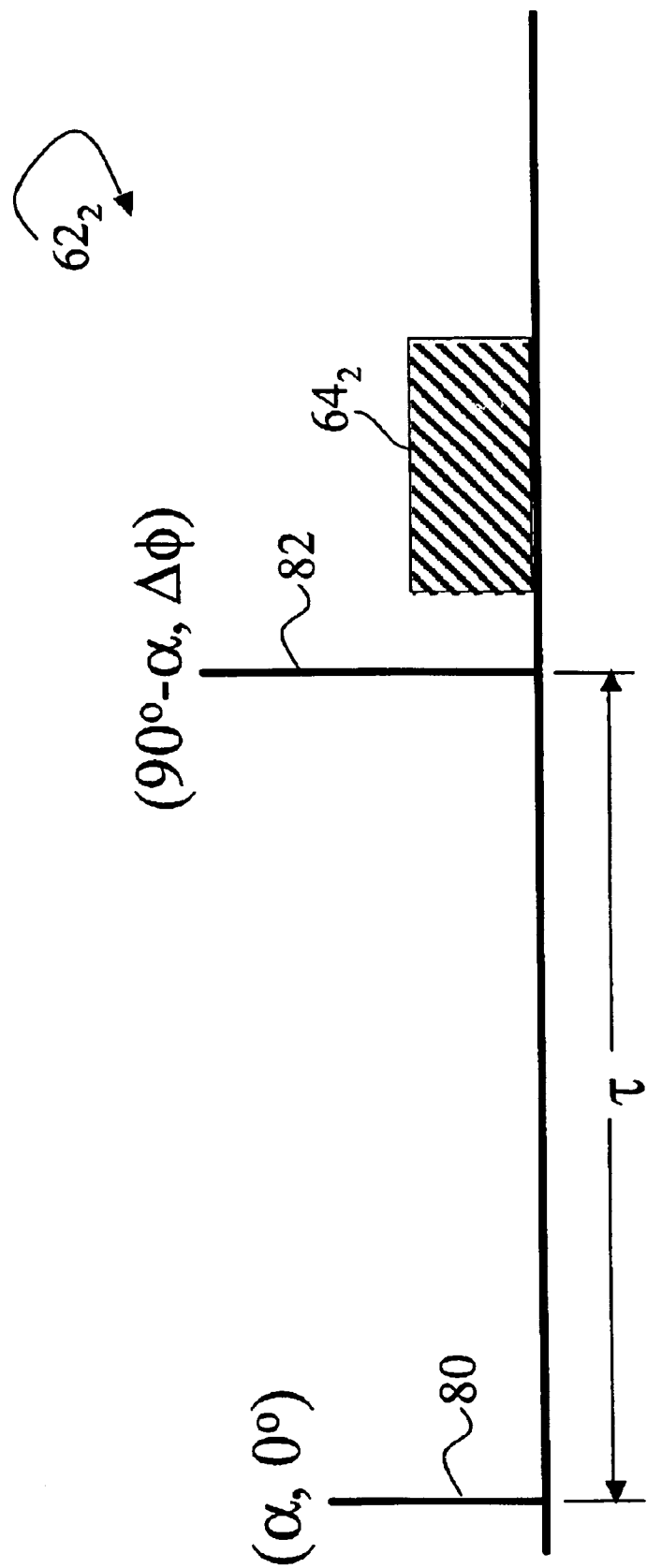
FIG. 4 diagrammatically shows a second exemplary priming sequence for preparing a longitudinal magnetization state for steady state magnetic resonance imaging.

With reference to FIG. 4, another suitable longitudinal preparation sequence $62_2$ includes radio frequency pulses 80, 82 temporally separated by $\tau$ where $\tau$ is again the temporal spacing of radio frequency excitation pulses of the CBASS or other steady state imaging. Each of the radio frequency pulses 80, 82 is labeled with an $(\theta_1, \theta_2)$ index as in FIG. 3. The preparation sequence $62_2$ produces a suitable periodic magnetization $M_z$, of the form of equation (2), in which $E(\psi)=\sin^2(\psi\Delta\phi)$ and $A=\sin(2\alpha)$. Preferably, a spoiler magnetic field gradient pulse $64_2$ follows the longitudinal preparation sequence $62_2$.

Figure 5:
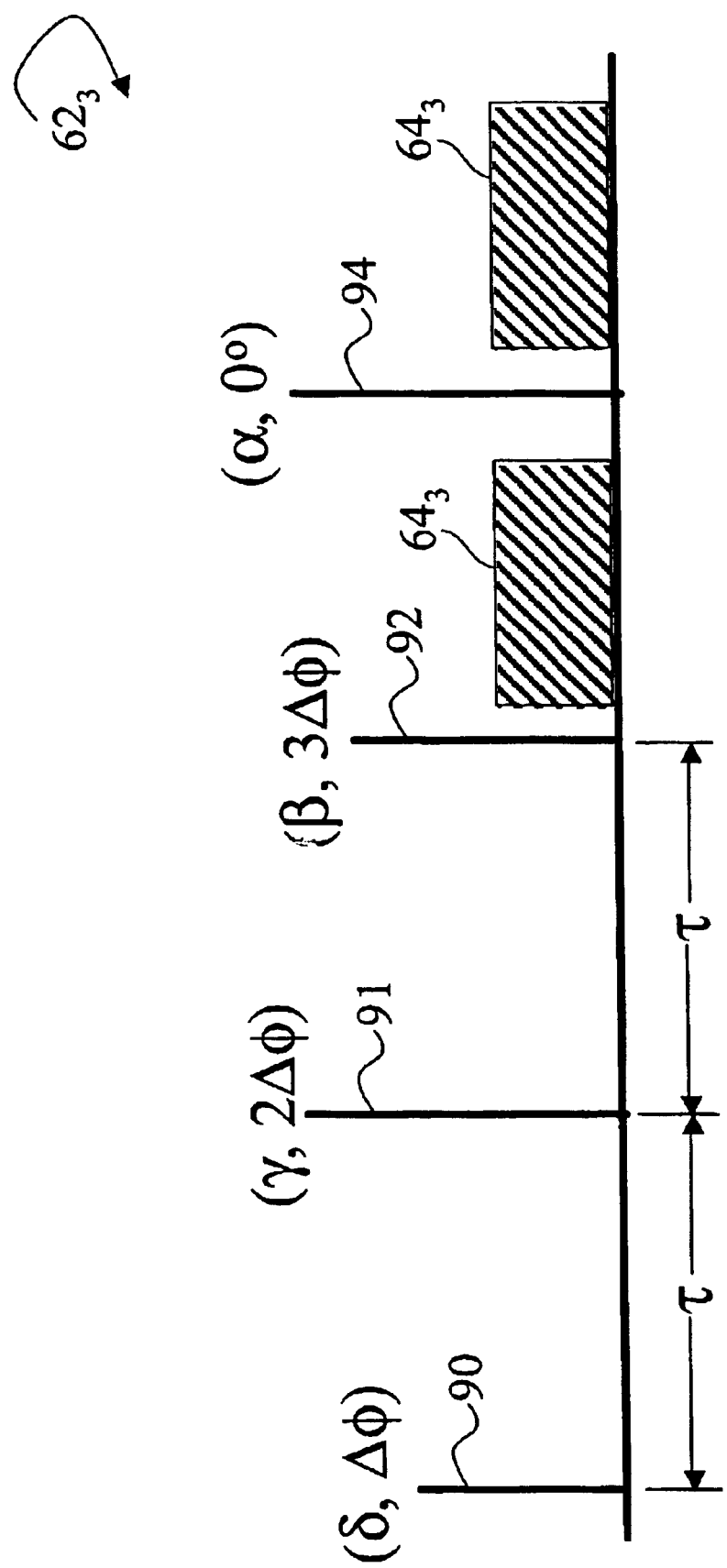
FIG. 5 diagrammatically shows a third exemplary priming sequence for preparing a longitudinal magnetization state for steady state magnetic resonance imaging.

With reference to FIG. 5, in yet another suitable longitudinal preparation sequence $62_3$, a binomial pulse includes three radio frequency pulses 90, 91, 92 of flip angles $\delta\gamma$ and $\beta$ respectively, which are temporally separated by the inter-pulse spacing $\tau$. The binomial pulse is followed by a fourth radio frequency pulse 94 with a flip angle $\alpha$. The flip angles $\delta\gamma$ and $\beta$ of the radio frequency pulses 90, 91, 92 comprising the binomial pulse are adjusted so the overall tip angle of the binomial pulse is $64_3$. Preferably, spoiler magnetic field gradient pulses $64_3$ are interleaved with the longitudinal preparation sequence $62_3$.

The phases of the pulses 90, 91, 92 that form the binomial pulse are suitably set to multiples of $\Delta\phi$ to shift the shaped $M_z$ longitudinal magnetization through the spectral offset angle $\Delta\phi$, and the tip angles of the individual binomial pulse components 90, 91, 92 are preferably trimmed to optimize the shape of the $M_z$ longitudinal magnetization. The fourth pulse 94 of flip angle α provides longitudinal magnetization scaling of $M_0 \cos(\alpha)$. The binomial pulse amplitudes can be designed using the Shinnar-LaRoux method or other similar methods to obtain longitudinal magnetization shaping for a given number of pulses, tissue relaxation times, and inter-pulse spacing τ values.

The transverse priming sequence 66 prepares the transverse magnetization by tipping the longitudinally aligned fan of magnetization isochromats produced by the cooperating longitudinal priming sequence 62 and spoiler sequence 64 away from longitudinal alignment to an angle defined by steady state longitudinal and transverse magnetizations of the CBASS or other steady state imaging.

Figure 6:
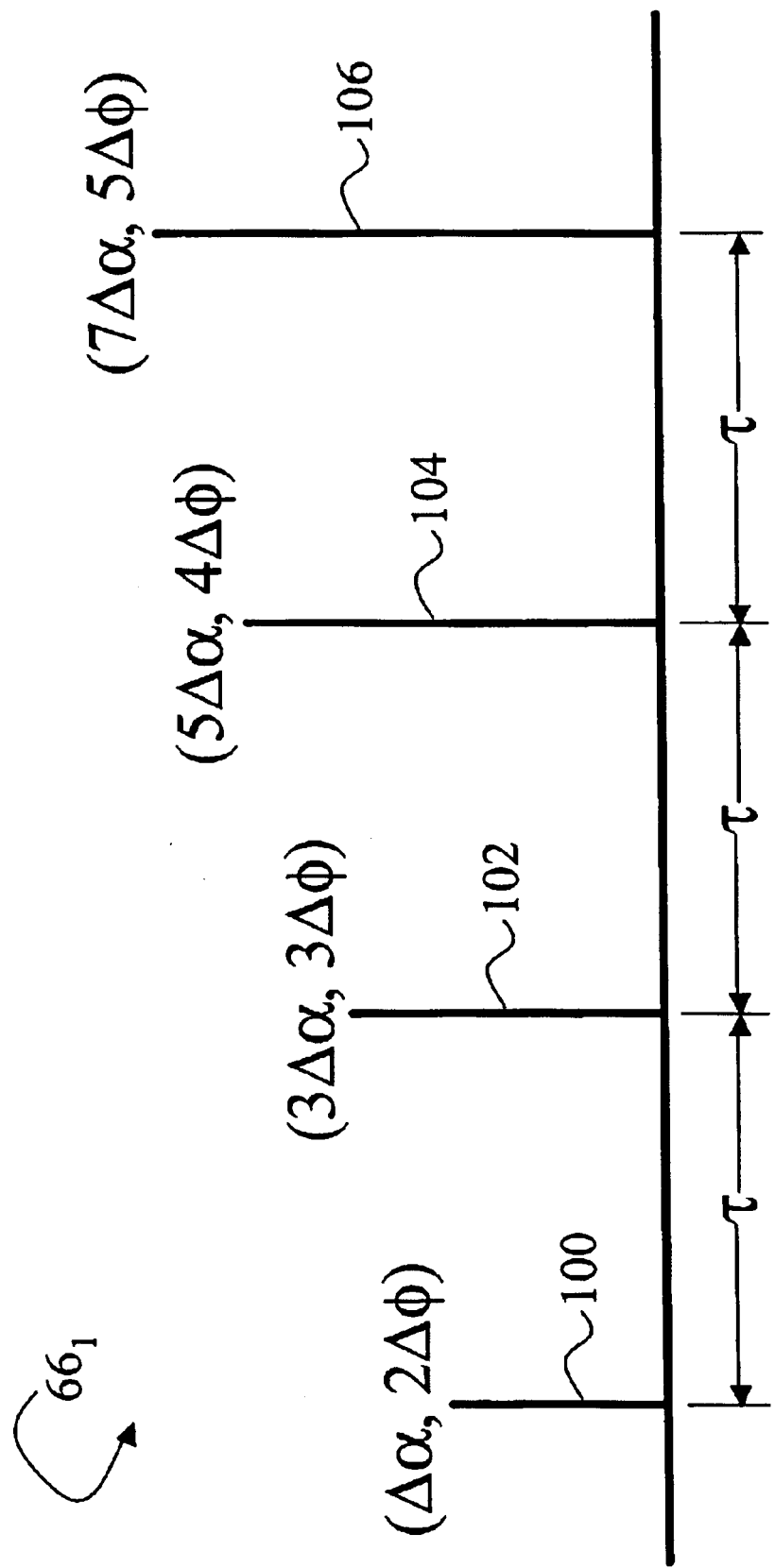
FIG. 6 diagrammatically shows an exemplary priming sequence for preparing a transverse-magnetization state for steady state magnetic resonance imaging.

With reference to FIG. 6, one suitable transverse preparation sequence $66_1$ includes a series of radio frequency pulses 100, 102, 104, 106 that are temporally spaced by the steady state image sequence radio frequency pulse repeat time τ and are successively incremented in phase by the spectral shift Δϕ. Thus, the transverse preparation sequence $66_1$, corresponds to a "dummy" image sequence which is designed to tip the fan of magnetization isochromats. The exemplary radio frequency pulses 100, 102, 104, 106 have flip angles of Δα, 3Δα, 5Δα, 7Δα respectively.

The tipping of the fan of magnetization isochromats by the radio frequency pulses 100, 102, 104, 106 is linear in the angular sense, since each successive pulse operates on the fan of magnetization isochromats after they have undergone 180° precession during the inter-pulse period. Hence, each successive radio frequency pulse increases the angular tip of the fan by equal increments Δα until the steady state tip angle (α) is reached. The angular increment between successive pulses of the transverse priming sequence 66 maintained at the spectral offset Δϕ.

The transverse priming sequence $66_1$ is a specific sequence of a more general preferred transverse priming sequence in which a series of M radio frequency pulses are spaced by the steady state excitation spacing τ, with successive pulses incremented in phase by Δϕ, and the flip angle of the nth pulse is given by:

$$Flipangle(n) = \alpha \cdot \frac{2n+1}{2M+1}, \quad n = 0, 1, 2, \ldots(M-1), \quad (3)$$

where α is the final flip angle used during steady state imaging and n is an integer index that indexes successive pulses from n=0 to n=M−1.

Other transverse magnetization priming sequences that ramp the tip angle can also be employed. Parameters for a specific priming sequence can be computed for given relaxation times T1 and T2, a given imaging flip angle α, a given inter-pulse spacing τ, and a transverse magnetization priming sequence pulse train of length M pulses. The linear radio frequency pulse sequences described above have an advantage of simplicity. Moreover, such sequences can be employed in a time-reversed fashion to return the fan of magnetization isochromats for a brief period of storage in the longitudinally aligned orientation. Time-reversed transverse primer sequences can therefore be beneficial for combining steady state imaging with pre-saturation techniques. Pre-saturation can be applied to the spin system during the magnetization storage period and steady state imaging can then be restarted by using the time-forward transverse priming sequence.

More generally, the primer sequence 60 can be adjusted empirically or analytically to provide a good approximation to the steady state magnetization during steady state imaging for several tissue types of interest each having different T1 and T2 relaxation times. The scaling for the longitudinal magnetization $M_z$ is adjustable, for example based on the flip angle α for the longitudinal magnetization priming sequences $62_1$, $62_2$ of FIGS. 3 and 4. The $M_z$ scale factor can be adjusted to compensate for reduction in the available longitudinal magnetization due to incomplete T1 recovery when steady state imaging is restarted.

The $M_z$ scale factor is optionally parameterized, for example by making the flip angle α a parameter in the longitudinal magnetization priming sequences $62_1$, $62_2$. This makes the priming sequence generator 34 further controllable for specific applications. Relaxation times T1 and T2 are readily calibrated for varying magnetic field strengths and for different tissue types. These values can be used to compute the $M_z$ scaling factor to provide optimized contrast between target tissue types for a specific imaging task.

Figure 7:
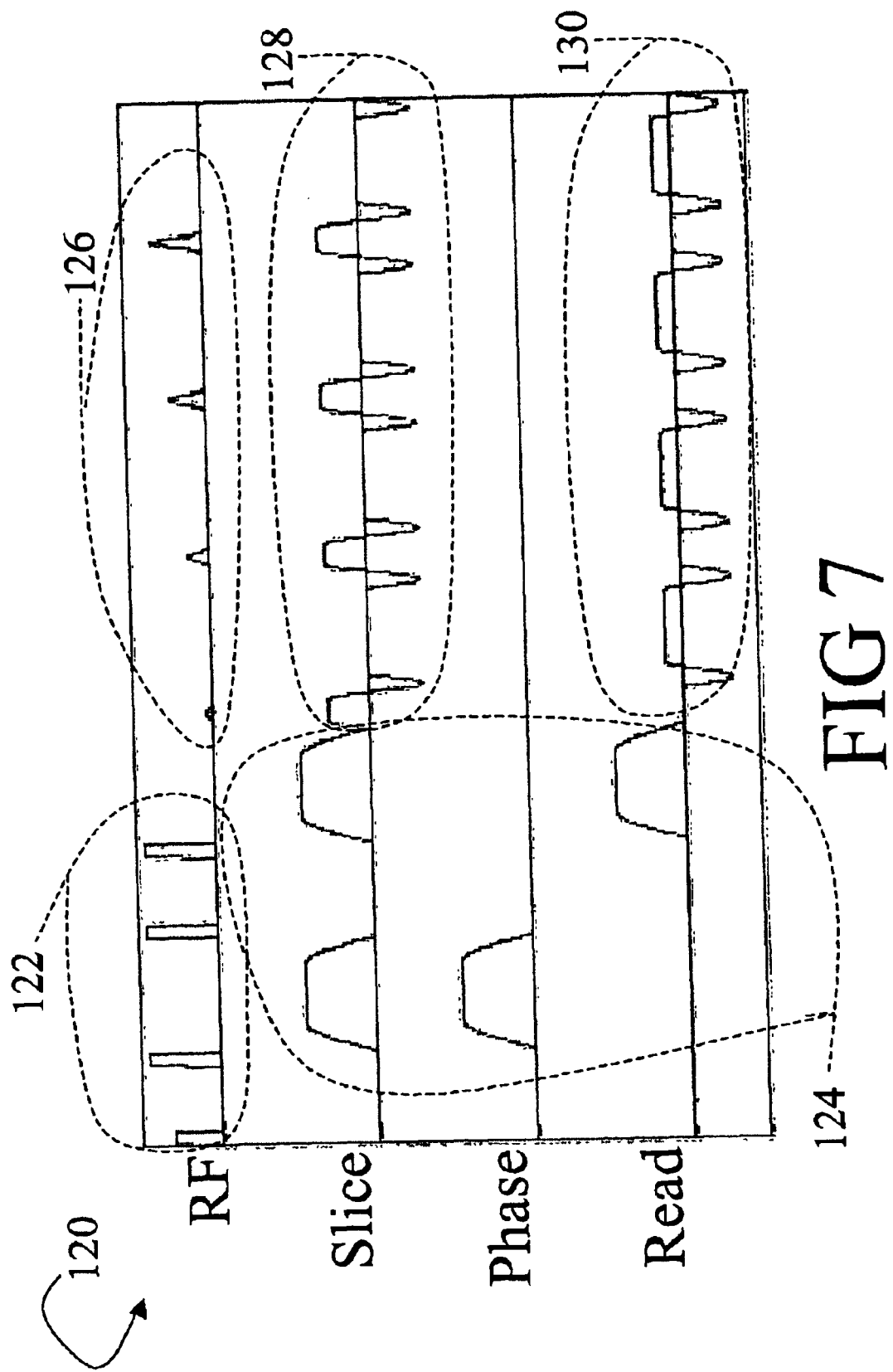
FIG. 7 shows an exemplary complete priming sequence, including longitudinal magnetization priming, spoiling, and transverse magnetization priming, for preparing a magnetization state for steady state magnetic resonance imaging.

With reference to FIG. 7, an exemplary parameterized priming sequence 120 includes a four-pulse longitudinal magnetization priming sequence 122, a spoiler sequence 124 including several magnetic field gradient pulses that are interleaved with the longitudinal magnetization priming sequence 122, and a four-pulse transverse magnetization priming sequence 126. The priming sequence 120 optionally includes balanced spatial encoding slice- and read-magnetic field gradients 128, 130 that are balanced so as to introduce no net magnetic resonance phase shifts. The steady state imaging sequence (not shown in FIG. 7) follows immediately, maintaining the temporal interval between radio frequency pulses.

Figure 8A:
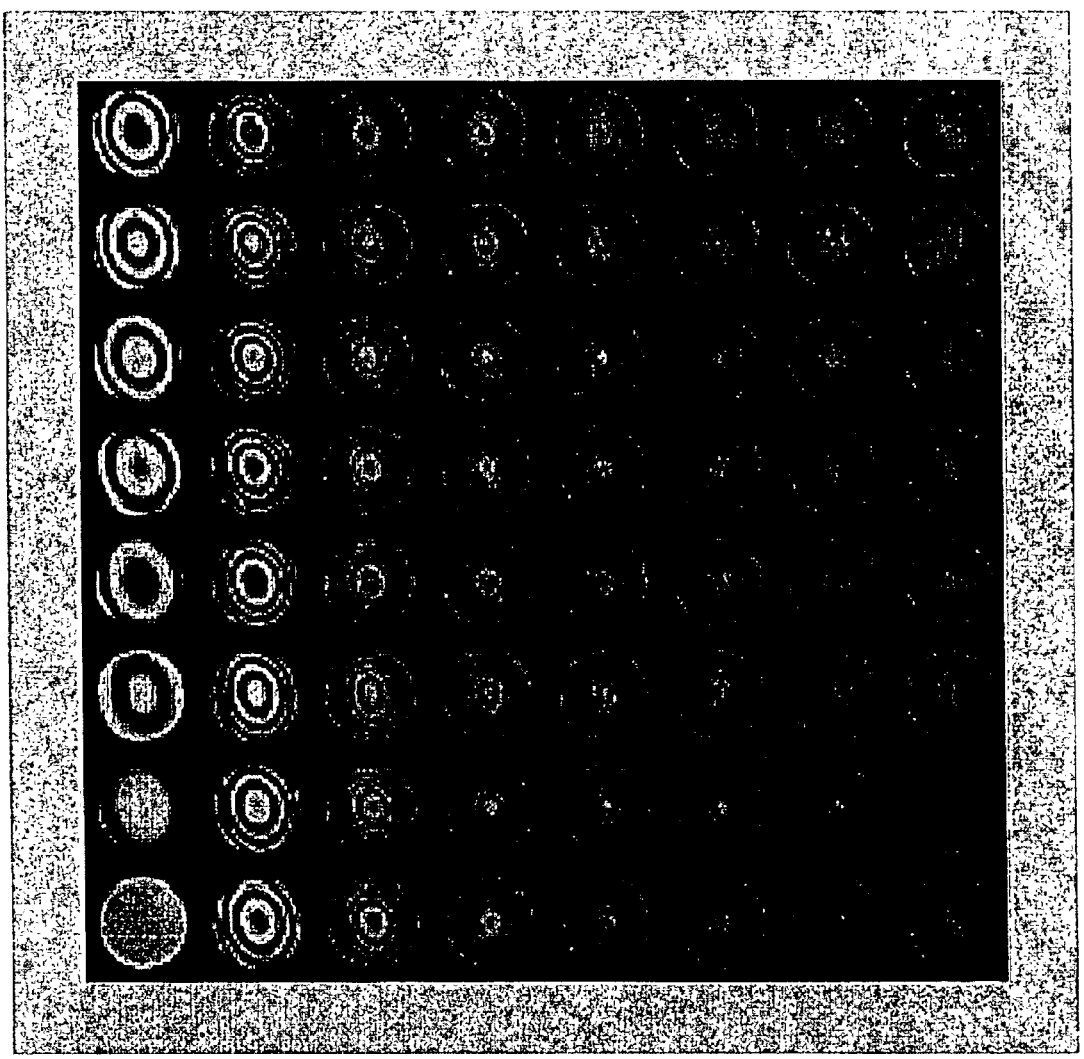
FIG. 8A shows a temporal sequence of sixty-four images acquired using completely balanced steady state free precession imaging (CBASS) without any priming sequence.
Figure 8B:
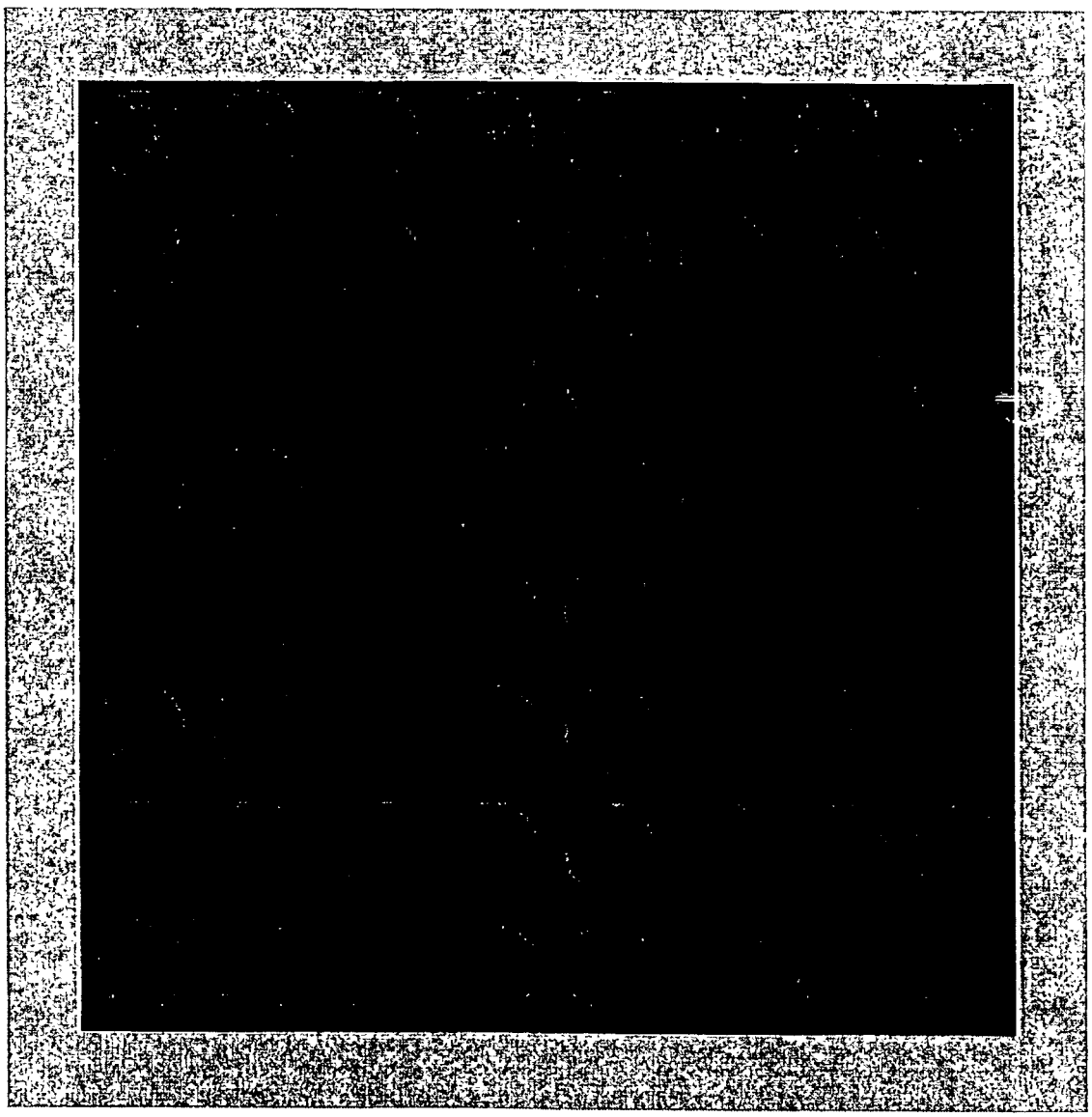
FIG. 8B shows a corresponding temporal sequence of sixty-four images acquired using CBASS with the priming sequence of FIG. 7.

With reference to FIGS. 8A and 8B, a comparison is made between CBASS imaging of a spatially uniform phantom with and without the primer sequence 120 of FIG. 7. Each of FIG. 8A and FIG. 8B show a series of images with the first acquired image at the upper left corner, and images acquired at increasing times arranged along the rows and down the columns, with the last (sixty-fourth) acquired image positioned at the lower right corner. FIG. 8A shows CBASS imaging without the priming sequence 120. The first eight images shown in the topmost row, in particular, show readily apparent dynamic banding image non-uniformities due to transient oscillations in the imaging signal as the CBASS steady state is slowly approached. The next eight images in the second row also have noticeable banding artifacts.

In contrast, FIG. 8B shows CBASS imaging with the primer sequence 120 executed prior to imaging. Dynamic banding nonuniformities are substantially reduced, especially in the first eight images acquired, shown in the topmost row.

FIG. 9 shows a quantitative comparison of image uniformity for the image sequence acquired without priming (labeled "Unprimed" and corresponding to the images of FIG. 8A) versus the image sequence acquired using the priming sequence 120 of FIG. 7 (labeled "Primed" and corresponding to the images of FIG. 8B). A very large improvement in image uniformity with the priming is seen for the first two dozen images, and even at the last (sixty-fourth) image quantitative some uniformity improvement is observed.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A steady state magnetic resonance imaging apparatus including:
   a means (10, 22, 24, 30, 34, 40) for priming magnetic resonance using a parameterized priming sequence, the parameterized priming sequence having a spectral offset parameter value corresponding to a first spectral offset;
   a means (10, 22, 24, 30, 42) for acquiring imaging data using steady state magnetic resonance imaging at the first spectral offset subsequent to the priming; and
   a means (44) for reconstructing the imaging data to generate an image representation.

2. The apparatus as set forth in claim 1, wherein the parameterized priming sequence generating means includes:
   a means (62) for generating a longitudinal priming sequence that prepares longitudinal magnetization in a state approximating a steady state longitudinal magnetization, the longitudinal priming sequence including:
      a first radio frequency pulse at a selected flip angle, and
      a second radio frequency pulse with a flip angle corresponding to 90° minus the selected flip angle,
      the first and second radio frequency pulses being temporally spaced by a temporal spacing of excitation pulses of the steady state magnetic resonance imaging, and
      the first and second radio frequency pulses being relatively phase-shifted by an amount determined by the spectral offset parameter value;
   a means (64) for generating a spoiler sequence that spoils transverse magnetization while retaining longitudinal magnetization; and
   a means (66) for generating a transverse priming sequence that prepares traverse magnetization in a state approximating a steady state transverse magnetization.

3. The apparatus as set forth in claim 2, wherein the transverse priming sequence includes:
   a sequence of radio frequency pulses in which successive pulses are each phase-shifted by a selected. amount determined from the spectral offset parameter value.

4. The apparatus as set forth in claim 2, wherein the transverse priming sequence includes:
   a series of radio frequency pulses, each radio frequency pulse having a tip angle of $(2n+1)\Delta\alpha$ where n is an integer index of successive pulses starting at n=0 and $\Delta\alpha$ is a tip angle of the first pulse.

5. The apparatus as set forth in claim 1, wherein the priming sequence generating means (10, 22, 24, 30, 34, 40) and the data acquiring means (10, 22, 24, 30, 42) repeat the priming and acquiring of imaging data for at least one other spectral offset, and the apparatus further includes:
   a means (38) for combining imaging data at the first spectral offset and at the at least one other spectral offset to generate combined imaging data, the reconstructing means (44) reconstructing the combined imaging data to generate the image representation.

6. The apparatus as set forth in claim 5, wherein the first spectral offset and the at least one other spectral offset include spectral offsets at $\theta_0 + 360° \times (n/N)$, where N specifies a total number of spectral offsets, n is a spectral offset index running from 0 to N−1, and $\theta_0$ is an angular offset value.

7. An apparatus for steady state magnetic resonance imaging, the apparatus including:
   a priming sequence generator (34) that generates a parameterized priming sequence configured using a spectral offset parameter (40);
   a magnetic resonance imaging scanner (10) that primes magnetic resonance using the parameterized priming sequence configured to a selected spectral offset and, subsequent to the priming, acquires imaging data using steady state magnetic resonance imaging at the selected spectral offset; and
   a reconstruction processor (44) that reconstructs imaging data to generate an image representation.

8. The apparatus as set forth in claim 7, further including:
   a phase-cycling processor (38) that repeats the priming and acquiring of imaging data for at least one other spectral offset, and combines imaging data at the first spectral offset and at the at least one other spectral offset to generate combined imaging data from which the reconstruction processor (44) generates the image representation.

9. A steady state magnetic resonance imaging method including:
   priming magnetic resonance using a parameterized priming sequence, the parameterized priming sequence having a spectral offset parameter value corresponding to a first spectral offset;
   subsequent to the priming, acquiring imaging data is using steady state magnetic resonance imaging at the first spectral offset; and
   reconstructing the imaging data to generate an image representation.

10. The imaging method as set forth in claim 9, wherein the parameterized priming sequence includes:
    a longitudinal priming sequence that prepares longitudinal magnetization in a state approximating a steady state longitudinal magnetization;
    a spoiler sequence that spoils transverse magnetization while retaining longitudinal magnetization; and
    a transverse priming sequence that prepares traverse magnetization in a state approximating a steady state transverse magnetization.

11. The imaging method as set forth in claim 10, herein the spoiler sequence is interleaved with the longitudinal primer sequence.

12. The imaging method as set forth in claim 10, wherein the longitudinal priming sequence includes:
    a binomial sequence.

13. The imaging method as set forth in claim 10, wherein the longitudinal priming sequence produces a squared sinusoidal longitudinal magnetization having zeroes conforming with the steady state longitudinal magnetization.

14. The imaging method as set forth in claim 10, wherein the longitudinal priming sequence produces a longitudinal magnetization having zeroes conforming with the steady state longitudinal magnetization.

15. The imaging method as set forth in claim 10, wherein the longitudinal priming sequence includes:
    a first radio frequency pulse at a selected flip angle; and
    a second radio frequency pulse with a flip angle corresponding to 90° minus the selected flip angle;
    the first and second radio frequency pulses being temporally spaced by a temporal spacing of excitation pulses of the steady state magnetic resonance imaging; and
    the first and second radio frequency pulses being relatively phase-shifted by an amount determined by the spectral offset parameter value.

16. The imaging method as set forth in claim 10, wherein the longitudinal priming sequence includes:
    a sequence of radio frequency pulses in which successive pulses are each phase-shifted by a selected amount determined from the spectral offset parameter value.

17. The imaging method as set forth in claim 10, wherein the longitudinal priming sequence and the spoiler cooperate to generate a longitudinally aligned fan of magnetization isochromats.

18. The imaging method as set forth in claim 17, wherein the transverse priming sequence acts upon the longitudinally aligned fan of magnetization isochromats, the transverse priming sequence including:

a sequence of radio frequency pulses that tip the tan of longitudinally aligned magnetization isochromats away from longitudinal alignment to an angle defined by the steady state longitudinal and transverse magnetizations.

19. The imaging method as set forth in claim 18, further including:

applying a reverse transverse priming sequence including the sequence of radio frequency pulses of the transverse priming sequence in reverse order to tip the fan of magnetization isochromats back to longitudinal alignment.

20. The imaging method as set forth in claim 19, further including: subsequent to the applying of the reverse transverse priming sequence, applying a pre-saturation magnetic resonance sequence; and subsequent to the pre-saturating, applying the transverse priming sequence to tip the fan of longitudinally aligned magnetization isochromats back to the angle defined by the steady state longitudinal and transverse magnetizations.

21. The imaging method as set forth in claim 10, wherein the transverse priming sequence includes a series of radio frequency pulses, successive radio frequency pulses increasing in phase by an amount determined by the spectral offset parameter value.

22. The imaging method as set forth in claim 10, wherein the transverse priming sequence includes a series of radio frequency pulses, each radio frequency pulse having a tip angle of $(2n+1)\Delta\alpha$, where n is an integer index of successive pulses starting at n=0 and $\Delta\alpha$ is the tip angle of the first pulse.

23. The imaging method as set forth in claim 10, wherein the acquiring of imaging data using steady state magnetic resonance imaging includes:

applying radio frequency pulses spaced at a selected inter-pulse spacing to maintain coherence of nuclear magnetization during the steady state magnetic resonance imaging.

24. The imaging method as set forth in claim 9, wherein the parameterized priming sequence includes two or more radio frequency pulses that cooperatively produce a longitudinal magnetization having zeroes conforming with the steady state longitudinal magnetization.

25. The imaging method as set forth in claim 9, wherein the parameterized priming sequence includes spatial encoding slice-select and read magnetic field gradients that are balanced and introduce no net magnetic resonance phase shift.

26. The imaging method as set forth in claim 9, further including:

repeating the priming and acquiring of imaging data for at least one other spectral offset; and combining imaging data at the first spectral offset and at the at least one other spectral offset to generate is combined imaging data, the combined imaging data being reconstructed to generate the image representation.

27. The imaging method as set forth in claim 26, wherein the combining of imaging data includes:

adding the image representations in k-space to remove bending artifacts.

28. The imaging method as set forth in claim 26, wherein the first spectral offset and the at least one other spectral offset include 0° and 180°.

29. The imaging method as set forth in claim 26, wherein the first spectral offset and the at least one other spectral offset include four spectral offsets angularly spaced at 90° increments.

30. The imaging method as set forth in claim 26, wherein the first spectral offset and the at least one other spectral offset include spectral offsets at phase increments of 360°/N where N specifies a total number of spectral offers.

* * * * *